United States Patent [19]

Kugimiya et al.

[11] Patent Number: 5,079,215

[45] Date of Patent: Jan. 7, 1992

[54] BI, ALKALINE EARTH, CU EXTRUDED OXIDE SUPERCONDUCTIVE MATERIAL HAVING A C-PLANE ORIENTATION GREATER THAN 80%

[75] Inventors: Kouichi Kugimiya, Toyonaka; Seiji Adachi, Neyagawa; Osamu Inoue, Moriguchi; Syunichiro Kawashima, Hirakata, all of Japan

[73] Assignee: Matsushita Electric Industrial Co., Ltd., Osaka, Japan

[21] Appl. No.: 569,370

[22] Filed: Aug. 14, 1990

Related U.S. Application Data

[63] Continuation-in-part of Ser. No. 534,376, Jun. 7, 1990, abandoned, which is a continuation-in-part of Ser. No. 306,304, Feb. 3, 1989, abandoned.

[30] Foreign Application Priority Data

Feb. 8, 1988 [JP] Japan .................................. 63-21720

[51] Int. Cl.$^5$ ...................... H01L 39/12; C01F 11/02; C01G 29/00
[52] U.S. Cl. ......................................... 505/1; 505/782; 505/739; 252/518; 252/521
[58] Field of Search ........................... 505/1, 782, 739; 252/518, 521

[56] References Cited

U.S. PATENT DOCUMENTS 4,942,151  7/1990  Capone et al. ...................... 505/741

OTHER PUBLICATIONS

Akimitsu, J. et al.: "Superconductivity in the Bi-Sr-Cu-O System", Jap. J. Appl. Phys., vol. 26, No. 12, Dec. 1987, pp. 12080-12081.
Dagani; R.: "New Class of Superconductors Discovered", C&EN, vol. 66, No. 5, Feb. 1, 1988, p. 5.
Dinger, T. R. et al.: "Direct Obersvation of Electronic Anisotropy in Single Crystal YiBa$_2$Cu$_3$O$_{7-x}$", Phys. Rev. Lett., 58, No. 25, Jun. 22, 1987, pp. 2687-2690.
Enomoto, Y. et al.: "Largely Anisotropic Superconducting . . . Thin Film", Jap. J. Appl. Phys., vol. 26, No. 7, Jul. 1987, pp. 4248-4250.
Michel, C. et al.: "Superconductivity in the Bi-Sr-Cu-O System", Z. Phys. B.-Condensed Matter, 68 (1987) pp. 421-423.
Nakao, M. et al.: "Magnetron Sputtering of Bi-Ca-Sr-Cu-O . . . Films with superconductivity above 80K", Jap. J. Appl. Phys., 27(3), Mar. 1988, pp. L378-L380.
Maeda et al.; "A New High-Tc Oxide Superconductor without a Rare Earth Element," Jap. Jrnl. App. Phys., vol. 27, No. 2, Feb. 1988, L209-L210.
Subramanian et al., "A New High-Temperature Superconductor Bi$_2$Sr$_{3-x}$Ca$_x$Cu$_2$O$_{8+y}$", Science, vol. 239, Feb. 26, 1988, 1015-1017.

Primary Examiner—Paul Lieberman
Assistant Examiner—Bradley A. Swope
Attorney, Agent, or Firm—Wenderoth, Lind & Ponack

[57] ABSTRACT

An oxide superconductive material comprising constituent elements mainly composed of ABiCuO in which A comprises at least one element of alkaline earth metals, and having a C-plane orientation, and a method of orienting such superconductive materials by hot extrusion from a rectangular nozzle.

5 Claims, No Drawings

BI, ALKALINE EARTH, CU EXTRUDED OXIDE SUPERCONDUCTIVE MATERIAL HAVING A C-PLANE ORIENTATION GREATER THAN 80%

This is a continuation-in-part of application Ser. No. 07/534,376, filed June 7, 1990, which in turn is a continuation-in-part of application Ser. No. 07/306,304, filed Feb. 3, 1989, both applications being now abandoned.

BACKGROUND OF THE INVENTION

This invention relates to oxide superconductive materials and a method of preparing such materials.

Recently, YBaCuO system materials have been reported as superconductives materials, and various tests and studies are being carried out on such materials. As a result, these materials have been reported as being very unstable and low in the critical current. Besides, the cost of such materials is high because rare earth elements are used in significant quantities, and the cost is susceptible to market fluctuations. It is desired to be improve upon these points.

More recently, new materials of an SrBiCuO system have been reported, but details are not known at the present time.

SUMMARY OF THE INVENTION

It is a primary object of this invention to present a material free from the above problems in respect to the critical current values, stability, and economic aspects of such materials.

The material of this invention is characterized firstly in the, the orientation of the C-plane of oxide superconductive materials and secondly resides in the use of ABiCuO as the principal constituents of the superconductive material (in which A comprises at least one kind of element composed of alkaline earth group metals).

This material is almost free from erosion by water or the like probably due to the nature of the orientation, since the oriented C-plane surface prevents the undesirable progress of erosion and further it does not contain rare earth elements and alkaline earth elements that causes instability as being in an unstable form. In addition, the solid solution range is estimated to be broad, and probably owing to this property, the material is stable in always containing a high temperature superconductor phase. Furthermore, since the C-plane orientation has a specific intra-plane Cu chain arrangement, it seems to contribute to the enhancement of the critical current. It seems that further excellent characteristics are obtained because a proper element-to-element distance is realized by mixing alkaline earth elements larger than and smaller than 1 Å in ion radius.

As a result, the materials of the present invention excels in economy because the materials have a high critical current and do not contain the expensive and marketably unstable rare.

While the novel features of the invention are set forth in the appended claims, the invention, both as to organization and content, will be better understood and appreciated, along with other objects and features thereof, from the following detailed description.

DETAILED DESCRIPTION OF THE INVENTION

As a result of follow-up tests on general recent YBaCuO system materials, the transition temperature was about 90° K., according to the investigation by the present inventors, even in the optimum composition of the so-called 123 (the ratio of Y/Ba/Cu). When the composition was slightly varied, an impurity phase was generated, and the characteristics fluctuated. This material was fabricated into a wire by hot extrusion at 950°, and the critical current was measured at 50° K. This value is called reference value 1 of this invention.

By contrast, according to the investigation of the present inventors, the new material possesses stable and excellent characteristics as follows.

Oxides containing at least one type each from a group of Mg, Ca of which the ion radius is 1 Å or less, and a group of Sr, Ba, and also Bi and Cu were weighed so that the ratio of the three A/Bi/Cu might be nearly 5/3/5, 3/2/3, 2/1/2 or in their vicinity, and were uniformly mixed, and temporarily sintered at 800° to 850°, crushed, formed and baked at 830° to 870°. A sintered polycrystalline material was thus-produced. The material was extruded at 800° C. A nozzle with a rectangular section having an axial ratio of 5/1 was used. It is known that the better results are obtained when this ratio is higher, but according to the experiment by the present inventors, if the ratio was 3/1 or over, a high C-plane orientation was obtained radiographically. In the X-ray diffraction diagram, the rate of (00n) intensity of the total of the oriented oxide superconductive materials is approximately over 80%.

The obtained results are shown in Table 1.

TABLE 1

| | Composition | | | | | | Transition temperature | Current ratio | Phase | Zero-resistance temperature |
|---|---|---|---|---|---|---|---|---|---|---|
| | Sr | Ca | Ba | Mg | Bi | Cu | | | | |
| 1 | 3.3 | 1.7 | 0 | 0 | 3 | 5 | 105 | 3 | Single | 101 |
| 2 | 3.8 | 2.2 | 0 | 0 | 4 | 5 | 108 | 4 | Single | 100 |
| 3 | 3.5 | 2.5 | 0 | 0 | 4 | 5 | 110 | 6 | Single | 106 |
| 4 | 4.5 | 1.5 | 0 | 0 | 5 | 4 | 113 | 2 | Single | T |
| 5 | 3.0 | 3.0 | 0 | 0 | 3 | 5 | 102 | 5 | Single | 99 |
| 6 | 0.5 | 0.5 | 0 | 0 | 1 | 1 | 82 | 1 | Plural | 78 |
| 7 | 1.5 | 1.5 | 0 | 0 | 2 | 2 | 81 | 2 | Plural | T |
| 8 | 1.0 | 1.0 | 0 | 0 | 1 | 2 | 101 | 9 | Plural | T |
| 9 | 2.0 | 2.0 | 0 | 0 | 2 | 3 | 84 | 2 | Plural | 83 |
| 10 | 2.0 | 2.0 | 1 | 1 | 4 | 5 | 106 | 4 | Single | 101 |
| 11 | 2.0 | 2.0 | 1 | | 3 | 5 | 101 | 4 | Single | 90 |
| 12 | 4.0 | 0.5 | 1 | 0.5 | 4 | 5 | 110 | 8 | Single | T |
| 13 | 2.0 | 1.0 | 0.5 | 0.5 | 2 | 3 | 101 | 8 | Plural | 95 |
| 14 | 2.0 | | | 2 | 2 | 3 | 23 | 0 | Plural | 12 |
| 15 | 1.5 | 1.5 | | | 2 | 3 | 105 | 4 | Single | 103 |
| 16 | 0.5 | 0.5 | 0 | 0 | 1 | 1 | 82 | 2 | Plural | T |
| 17 | 1.5 | 1.5 | 0 | 0 | 2 | 1 | 81 | 1 | Plural | T |
| 18 | 1.0 | 1.0 | 0 | 0 | 1 | 1 | 101 | 6 | Plural | 95 |
| 19 | 2.0 | 2.0 | 0 | 0 | 2 | 1 | 84 | 2 | Plural | T |

TABLE 1-continued

| | Composition | | | | | | Transition temperature | Current ratio | Phase | Zero-resistance temperature |
|---|---|---|---|---|---|---|---|---|---|---|
| | Sr | Ca | Ba | Mg | Bi | Cu | | | | |
| 20 | 2.0 | 1.0 | 0.5 | 0.5 | 2 | 1 | 101 | 3 | Plural | T |
| 21 | 0.5 | 0.5 | 0 | 0 | 0.2 | 1 | 103 | 4 | Single | T |
| 22 | 0.5 | 0.5 | 0 | 0 | 1/3 | 1 | 101 | 4 | Single | 94 |
| 23 | 0.5 | 1.0 | 0 | 0 | 0.2 | 1 | 110 | 9 | Single | T |
| 24 | 0.5 | 1.0 | 0 | 0 | 1/3 | 1 | 106 | 3 | Single | T |
| 25 | 0.5 | 1.0 | 0 | 0 | 1/4 | 1 | 113 | 7 | Single | 108 |
| 26 | 0.5 | 0.5 | 0.2 | 0.2 | 0.3 | 1 | 105 | 7 | Single | 96 |
| 27 | 0.3 | 0.6 | 0.2 | 0.1 | 0.3 | 1 | 101 | 2 | Single | 90 |
| 28 | 0.2 | 0.9 | 0.1 | | 1/4 | 1 | 102 | 6 | Single | T |
| 29 | 0.4 | 0.9 | | | 1/4 | 1 | 113 | 7 | Single | 106 |

As obvious from the table, the transition temperature was stable in all examples. Moreover, by mixing the elements of the two groups, the transition temperature was over 80° K. as compared with 20° to 30° K. in the case of a single group composition. In the humidity resistance test performed by subjecting the materials to high temperature and high humidity (60°, 60%) for a month, the so-called YBaCu system materials were whitened on the whole and were considerably decayed, whereas the new materials were only slightly whitened on the surface and were very stable. As known from Table 1, in spite of single phase and plural phases, basically, the ratio of the critical current to the reference value was remarkably improved in all materials (except for material 14), and excellent characteristics were found.

In respect to the superconductor material in Example 14 of Table 1, Sr and Ba are contained therein and have ionic radiuses larger then 1 Å. On the other hand, the other examples of this table were mixed, i.e. contained ions with a smaller ionic radius than 1 Å. Accordingly, it is presumed from the results shown therein that mixtures of components having different ionic radiuses were more effective in improving the properties of the final product than the individual components.

More precisely, a careful examination of the table shows that in the mixed states (wherein the ratios of A with a radius of 1 Å or larger in combination with an A component with an ionic radius of less than 1 Å was between 5/1-⅓) excellent results are obtained.

Further, when examining the data in Table 1, it is noted that when the averages of the ratio of Bi and Cu where computed, the ion ratio of Bi to Cu is ⅔. Further, it is noted that preferable ranges of the ion ratios are represented by $2 \geq A/Bi \geq 1.5$, $Bi/Cu < 1$, and $A/Cu \leq 2$, where A represents the sum of Sr and Ca. When such ratio exists, excellent characteristics are found within the broad scope of the materials of Table 1 in that compositions falling within this range exhibit remarkable effects as a super-conductor. Also, it is noted that excellent characteristics are found where $A/Bi > 4.5$.

As the X-ray analysis results show, a crystal phase in a composition ratio in the vicinity of the single 3/2/3 or 5/3/5 is formed in a considerably wide range (it is estimated, as presently investigated, to be composed of a superlattice of a pseudotetragonal system with a unit cell of 5.4 Å, considering together with the results of transmission electron microscopic findings, as being nominally expressed as an orthorhombic system with lattice constants of a=5.4 Å, b=5.4×5=27.0 Å and c=15.3×2=30.6 Å), and it is known that it is very easy to cleave on the C-plane.

It is assumed that the high orientation of more than 80% is due to the cleaving characteristics of the materials. Therefore, this technology of extension can be applied to other oxide superconducting materials which shows clear cleaving characteristics.

According to the invention, materials excelling in humidity resistance, broad in the solid solution range, large in critical current, and superior in safety and reproducibility may be produced, which may be widely applied in superconductive appliances.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. An extruded oxide superconductive sintered material consisting essentially of elements A, Bi, Cu and O having a C-plane orientation of greater than 80%, in which A is at least one member selected from the group consisting of Sr, Ca, Ba and Mg.

2. An extruded oxide superconductive sintered material having a C-plane orientation of greater than 80% of A, Bi, Cu and O wherein A is selected from the group consisting of elements Sr, Ca, Ba and Mg and in which A is composed of a mixture of first elements having ion radiuses of 1 Å or more and second elements having ion radiuses of less than 1 Å, wherein the ratio of the number of first elements to that of the second elements varies between 5/1 and ⅓.

3. An extruded superconductive oxide sintered material according to claim 1 wherein the ratio of the number of elements of A to that of the element Bi varies between 3:1 and 3:2, and the ratio of Bi to that of Cu is about 2:3.

4. An extruded oxide superconductive material having a C-plane orientation greater than 80% consisting essentially of A, Bi, Cu and O wherein A is selected from the group consisting of the elements, Sr, Ca, Ba and Mg and in which A is composed of a mixture of first elements having ionic radiuses of 1 Å or more and second elements having ionic radiuses less than 1 Å, wherein the ratio of the number of the elements A to that of the element Bi is $2 > A/Bi \geq 1.5$, the ratio of Bi to that of Cu is $Bi/Cu < 1$ and the ratio of the number of the elements A to that of Cu is $A/Cu \leq 2$.

5. An extruded oxide superconductive sintered material having a C-plane orientation of greater than 80% consisting essentially of A, Bi, Cu and O wherein A is Sr, Ca, Ba and Mg and is composed of a mixture of first elements of which the ionic radiuses are 1 Å and more and second elements having ionic radiuses of less than 1 Å, wherein the ratio of the number of elements A to that of Bi is represented by $A/Bi > 4.5$.

* * * * *